(12) United States Patent
Greenhill et al.

(10) Patent No.: US 6,426,652 B1
(45) Date of Patent: Jul. 30, 2002

(54) DUAL-EDGE TRIGGERED DYNAMIC LOGIC

(75) Inventors: David J. Greenhill, Portola Valley; Pradeep Trivedi, Sunnyvale, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/855,137

(22) Filed: May 14, 2001

(51) Int. Cl.[7] .......................................... H03K 19/0175

(52) U.S. Cl. .................... 326/83; 326/119; 326/121; 327/115; 327/117

(58) Field of Search ............................. 326/93, 95, 98, 326/56–58, 83, 121, 119; 327/115, 117, 99, 299

(56) References Cited

U.S. PATENT DOCUMENTS

| | | | | |
|---|---|---|---|---|
| 5,760,610 A | * | 6/1998 | Naffziger | 326/93 |
| 5,828,249 A | * | 10/1998 | Sessions | 327/115 |
| 6,025,738 A | * | 2/2000 | Masleid | 326/83 |
| 6,246,259 B1 | * | 6/2001 | Zaliznyak et al. | 326/41 |

* cited by examiner

Primary Examiner—Michael Tokar
Assistant Examiner—Vibol Tan
(74) Attorney, Agent, or Firm—Rosenthal & Osha L.L.P.

(57) ABSTRACT

A method and apparatus for performing logic operations using dual-edge triggered dynamic logic families is provided. Further, a method for performing logic operations using a self-resetting mechanism within dual-edge triggered dynamic logic blocks is provided. Further, a dual-edge triggered dynamic circuit that maintains a duty cycle of an input signal at its output is provided. Further, a method for providing a buffer mechanism for clock distribution purposes is provided.

27 Claims, 10 Drawing Sheets

DUAL-EDGE TRIGGERED DYNAMIC LOGIC

BACKGROUND OF THE INVENTION

The design of a computer system may be broken down into three parts system design, logic design, and circuit design. System design involves breaking the overall system into subsystems and specifying the characteristics of each subsystem. For example, system design of a computer system could involve specifying the number and type of memory units, arithmetic units, and input-output devices as well as the interconnection and control of these subsystems. Logic design involves determining how to interconnect basic logic building blocks to perform a specific function. An example of logic design is determining the interconnection of logic gates and flip-flops to perform binary addition. Circuit design involves specifying the interconnection of specific components such as resistors, diodes, and transistors to form a gate, flip-flop, or other logic building block.

There are various logic families that are used in circuit design. Each family has its own capabilities and limitations. Diode logic ("DL") families use diodes to perform certain logic functions. The use of DL families is simple and inexpensive, and can be used effectively in specific situations. Resistor-transistor logic ("RTL") families use resistors to combine multiple input signals and a transistor to amplify and invert the resulting combined signal. Like the DL families, the use of RTL families is simple and inexpensive. In addition, they are also useful because both normal and inverted signals are usually available. Diode-transistor logic ("DTL") families use DL combined with a transistor at the output in order to provide logic inversion and to restore a signal to full logic levels. Transistor-transistor logic ("TTL") families replace all input diodes in DTL with transistors. Emitter-coupled logic ("ECL") families are designed to operate at extremely high speeds by avoiding delays that are inherent when a transistor becomes saturated. Complementary metal-oxide-semiconductor ("CMOS") logic families use metal-oxide-semiconductor field-effect transistors ("MOSFETs").

The use of MOSFET transistors is beneficial because lower currents are needed to operate these transistors than other types of devices. However, MOSFETs operate slower than devices used in other logic families. MOSFETs may be divided into two types of transistors: positive-channel metal-oxide semiconductor ("PMOS") transistors and negative-channel metal-oxide semiconductor ("NMOS") transistors. A transistor is 'on' when there is an electrical pathway across the transistor such that a voltage at one terminal of the transistor can be seen at another terminal of the transistor. NMOS transistors can be switched 'on' or 'off' by the movement of electrons, whereas PMOS transistors can be switched 'on' or 'off' by the movement of electron vacancies. Every MOSFET has a voltage threshold ("$V_T$") value, which is the voltage level at which the MOSFET switches 'on' or 'off.' Generally, a NMOS transistor switches 'on' when there is a high voltage applied to a gate terminal of the NMOS transistor and a PMOS transistor switches 'on' when there is a low voltage, e.g., ground, applied to a gate terminal of the PMOS transistor. Moreover, for the purposes of this application, the gate terminal of a MOSFET transistor will be referred to as the "input" of the transistor.

Like other logic families, CMOS logic families may be divided into two categories: static logic and dynamic logic. Static logic is logic in which the function of a circuit is not synchronized by a global signal, e.g., a clock signal. The output of the circuit is solely a function of the input to the circuit. Moreover, the output is asynchronous with respect to the input. Dynamic logic is logic in which the output of a circuit is synchronized by a global signal. Therefore, the output of a dynamic circuit is a function of both the input(s) to the circuit and the global signal.

An example of a CMOS logic family is CMOS buffer logic. Buffer logic is necessary in order to restore signals to full voltage levels. For example, a signal that should be at 5 volts may only be at 4 volts at a specific point in a circuit due to voltage dissipation. In order to ensure that a signal is at its true desired voltage level, a buffer inputs the signal and outputs a restored signal with a full voltage level. Alternatively, buffer logic can also be used to restore a 0 volt signal. Also, buffer logic can be used to set a signal to a desired voltage that is different in value from a full voltage level value.

Figure 1:
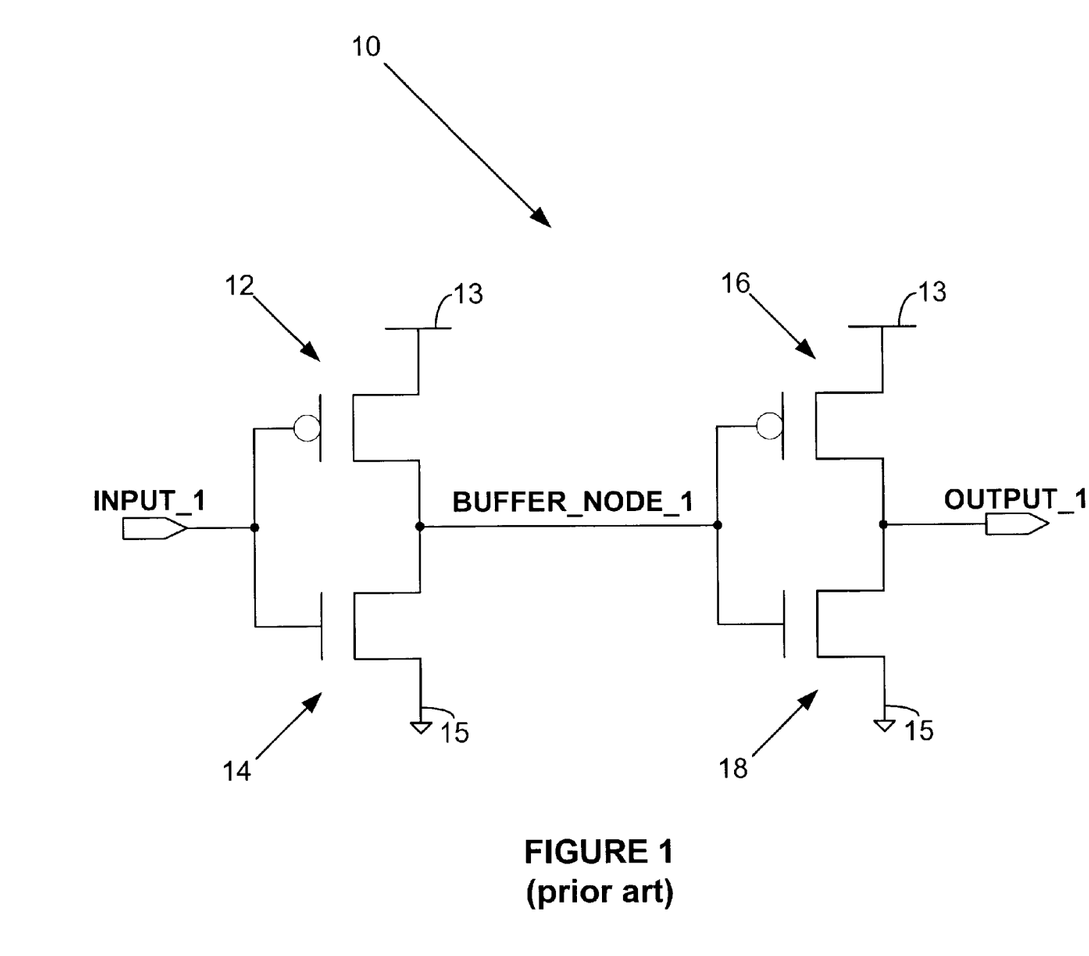
FIG. 1 shows a prior art embodiment of static logic.

FIG. 1 shows a prior art embodiment of static buffer logic that uses CMOS transistors. The static buffer (10) includes an input, INPUT_1, followed by two cascaded transistor pairs. The first pair of transistors ("the first pair"), the pair of transistors that immediately follows INPUT_1, includes a PMOS transistor (12) (referred to hereafter as "the PMOS transistor (12) in the first pair") and a NMOS transistor (14) (referred to hereafter as "the NMOS transistor (14) in the first pair"). INPUT_1 serves as an input to both the PMOS transistor (12) in the first pair and the NMOS transistor (14) in the first pair. The PMOS transistor (12) in the first pair has a terminal connected to a voltage source (13) (also referred to as "connected to high") and another terminal that is connected to both a terminal of the NMOS transistor (14) in the first pair and a node, BUFFER_NODE_1. The NMOS transistor (14) in the first pair, in addition to having a terminal that is connected to both a terminal of the PMOS transistor (12) in the first pair and BUFFER_NODE_1, has another terminal connected to ground (15) (also referred to as "connected to low").

The second pair of transistors ("the second pair"), the pair of transistors that follows the first pair of transistors, also includes a PMOS transistor (16) (referred to hereafter as "the PMOS transistor (16) in the second pair) and a NMOS transistor (18) (referred to hereafter as "the NMOS transistor (18) in the second pair"). BUFFER_NODE_1 serves as an input to both the PMOS transistor (16) in the second pair and the NMOS transistor (18) in the second pair. The PMOS transistor (16) in the second pair has a terminal connected to high (13) and another terminal that is connected to both a terminal of the NMOS transistor (18) in the second pair and the output of the static buffer (10), OUTPUT_1. The NMOS transistor (18) in the second pair, in addition to having a terminal that is connected to the PMOS transistor (16) in the second pair and OUTPUT_1, has another terminal connected to low (15).

When there is a rising edge, i.e., high, at INPUT_1, the PMOS transistor (12) in the first pair switches 'off' and the NMOS transistor (14) in the first pair switches 'on.' Since the NMOS transistor (14) in the first pair switches 'on,' BUFFER_NODE_1 gets connected to low (15) through the NMOS transistor (14) in the first pair. As BUFFER_NODE_1 goes low, the PMOS transistor (16) in the second pair switches 'on' and the NMOS transistor (18) in the second pair switches 'off.' Since the PMOS transistor (16) in the second pair switches 'on,' OUTPUT_1 gets connected to high (13) through the PMOS transistor (16) in the second pair. Therefore, when INPUT_1 goes high, OUTPUT_1 follows and goes high restoring any voltage dissipation that may have been present at INPUT_1.

Alternatively, when there is a falling edge, i.e., low, at INPUT_1, the PMOS transistor (12) in the first pair switches 'on' and the NMOS transistor (14) in the first pair switches 'off.' Since the PMOS transistor (12) in the first pair switches 'on,' BUFFER_NODE_1 gets connected to high (13) through the PMOS transistor (12) in the first pair. As BUFFER_NODE_1 goes high, the PMOS transistor (16) in the second pair switches 'off' and the NMOS transistor (18) in the second pair switches 'on.' Since the NMOS transistor (18) in the second pair switches 'on,' OUTPUT_1 gets connected to low (15) through the NMOS transistor (18) in the second pair. Therefore, when INPUT_1 goes low, OUTPUT_1 follows and goes low removing any stray voltage that may have been present at INPUT_1. Thus, with respect to both cases when INPUT_1 is either high or low, the static buffer (10) shown in FIG. 1 is static because the output is solely a function of the input to the static buffer (10). Further, the static buffer (10) is designed such that both rising and falling edges at the input of the circuit trigger changes in the output of the circuit.

Another behavioral aspect of the static buffer (10) shown in FIG. 1 deals with the voltage and current activity at the output of the static buffer (10). When an input to the static buffer (10) goes low to high or high to low, there is a finite amount of time that both the PMOS transistor (16) in the second pair and the NMOS transistor (18) in the second pair are 'on.' This happens because MOSFET transistors cannot be instantaneously switched 'off' or 'on.' Thus, when an input to the static buffer (10) changes, current flows through both the PMOS transistor (16) in the second pair and the NMOS transistor (18) in the second pair, and this causes what is known in the art as a "crow bar" effect, i.e., a short circuit, at the output of the static buffer. Generally, this "crow bar" effect is not desired because it causes the output to switch more slowly and lose power.

Relative to static logic, which is exemplified by the static buffer (10) in FIG. 1, dynamic logic operates faster. However, dynamic logic functions are monotonic, i.e., functions are triggered either by a rising edge or falling edge, but not both. In addition, typical dynamic logic uses a precharge transistor to lead the circuit to a known state to ensure a stable output.

Figure 2:
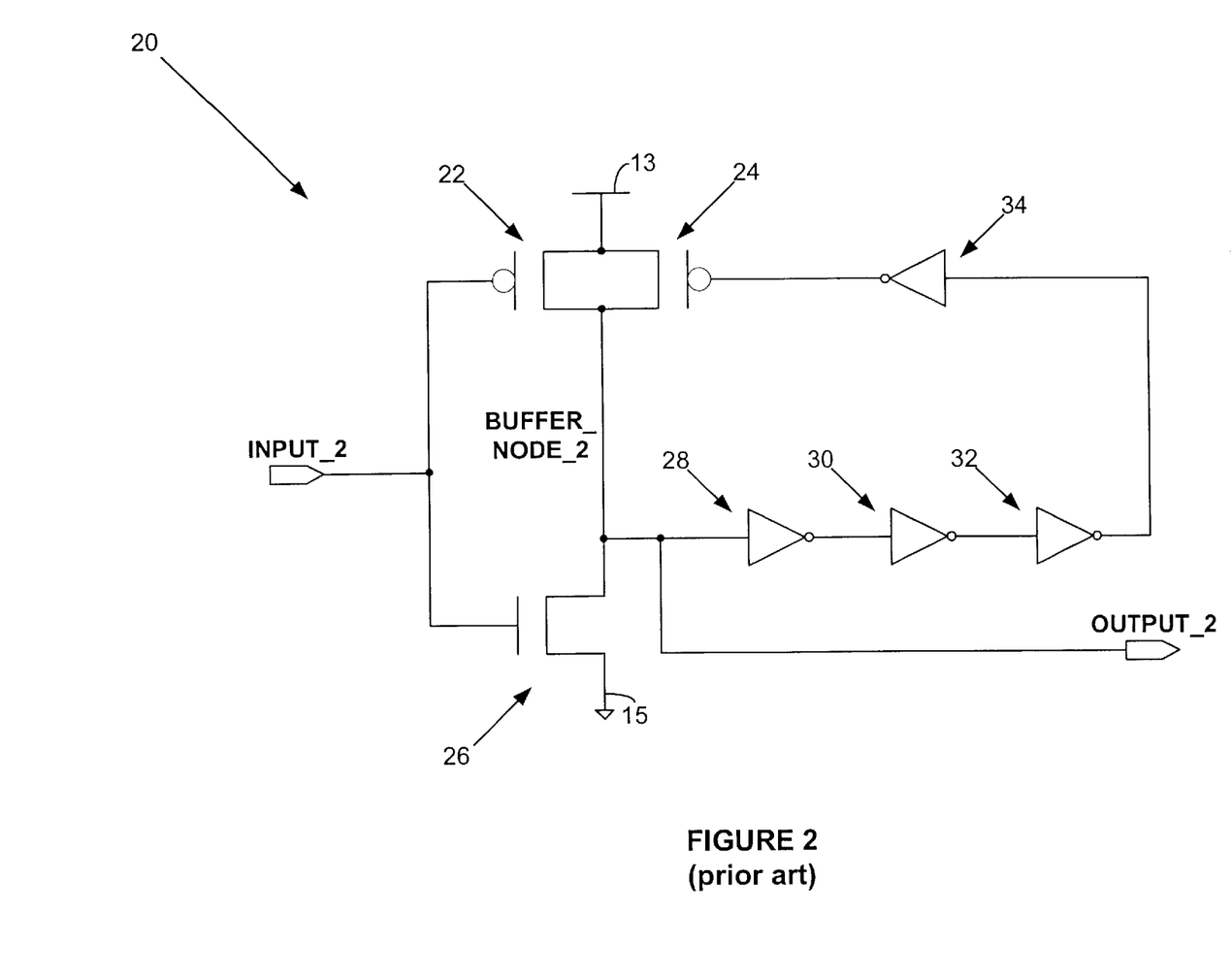
FIG. 2 shows a prior art embodiment of dynamic logic.

FIG. 2 shows a prior art embodiment of a single-edge triggered dynamic circuit (20) that can be used as a buffer. The single-edge triggered dynamic circuit (20), also known in the art as a "post-charge logic stage," includes an input, INPUT_2, which serves as an input to both a first PMOS transistor (22) and a NMOS transistor (26). The first PMOS transistor (22) has a terminal connected to high (13) and has another terminal connected to a node, BUFFER_NODE_2. The NMOS transistor (26) has a terminal connected to low (15) and has another terminal that is connected to BUFFER_NODE_2. The first PMOS transistor (22) is in parallel with a second PMOS transistor (24), which has a terminal connected to high (13) and another terminal connected to BUFFER_NODE_2. BUFFER_NODE_2 is directly connected to the output of the single-edge triggered dynamic circuit (20), OUTPUT_2, and also serves as an input to a chain of four inverters in series (28, 30, 32, 34). The output of the fourth inverter (34) in the chain of the four inverters (28, 30, 32, 34) serves as an input to the second PMOS transistor (24).

Typically, INPUT_2 is pre-conditioned, i.e., pre-charged, low. Thereafter, INPUT_2 pulses high, causing the first PMOS transistor (22) to switch 'off' and the first NMOS transistor to switch 'on.' When the first NMOS transistor (26) switches 'on,' BUFFER_NODE_2 goes low because it gets connected to ground (15) through the first NMOS transistor (26). Accordingly, OUTPUT_2, which is tied to BUFFER_NODE_2 also goes low.

Furthermore, when BUFFER_NODE_2 goes low, the input to the first inverter (28), which is tied to BUFFER_NODE 2, also goes low. Because the first inverter (28) inputs low, the fourth inverter (34) outputs low to the input of the second PMOS transistor (24), which, in turn, causes the second PMOS transistor (24) to switch 'on.'

Because the second PMOS transistor (24) switches 'on,' BUFFER_NODE_2 gets connected to high (13) through the second PMOS transistor (24). Accordingly, because BUFFER_NODE_2 goes high, OUTPUT_2 is reset back to high. However, because BUFFER_NODE_2 gets connected to high (13) through the second PMOS transistor (24), the first NMOS transistor (26) must switch 'off' before the second PMOS transistor (24) switches 'on.' Otherwise, a short circuit occurs between the high (13) and ground (15) terminals of the single-edge triggered dynamic circuit (20). Thus, before the second PMOS transistor (24) switches 'on,' INPUT_2 must go low to switch the first NMOS transistor (26) 'off.' Moreover, the purpose of the first PMOS transistor (22) is to hold OUTPUT_2 high when INPUT_2 is low.

An input signal that frequently needs to be buffered is a clock signal. Various circuits within a system are dependent upon the clock signal for purposes such as timing, signal alignment, toggling, etc. One characteristic of a clock signal deals with its duty cycle. The duty cycle of a signal denotes the fraction of time that a signal is active. For example, if a clock signal has a 50% duty cycle, then the signal is high for half the time in a given cycle and low for the other half of the time in the given cycle. One goal in buffering a clock signal is to try to as maintain the duty cycle of a clock signal such that the duty cycle of the clock signal at the output of a buffer is equal to the duty cycle of the clock signal at the input of the buffer. For example, in reference to FIG. 1, if there is a clock signal with a 50% duty cycle at INPUT_1, there will also be a clock signal with a 50% duty cycle at OUTPUT_1 since the static buffer (10) is triggered by both falling and rising edges at its input.

In reference to FIG. 2, if there is a clock signal with a 50% duty cycle at INPUT_2, the clock signal at OUTPUT_2 will have a duty cycle less than 50%. Essentially, this is because the circuit shown in FIG. 2 is triggered only by a single edge. At a rising edge of INPUT_2, OUTPUT_2 is triggered and follows low. However, INPUT_2 has to go low before OUTPUT_2 is reset back to high. Thus, OUTPUT_2 is low for a greater percentage of cycle time than is INPUT_2.

When a clock signal is separated into multiple signal paths for use by various circuits, the clock signal loses its strength. Therefore, computer systems incorporate clock distribution schemes in which a clock signal is split into multiple clock signals and then each clock signal is buffered before it is used as an input by a particular circuit within the system. Efficient and accurate buffers are needed in a clock distribution scheme to ensure that the duty cycle of a clock signal is not affected by the buffering in the clock distribution scheme. For example, in reference to FIG. 1, the static buffer (10) may be used in a clock distribution scheme since it maintains the same duty cycle at its input and output. However, the single-edge triggered dynamic circuit (20) cannot be used in a clock distribution scheme because its dynamic behavior does not maintain the same duty cycle at its input and output.

Figure 3:
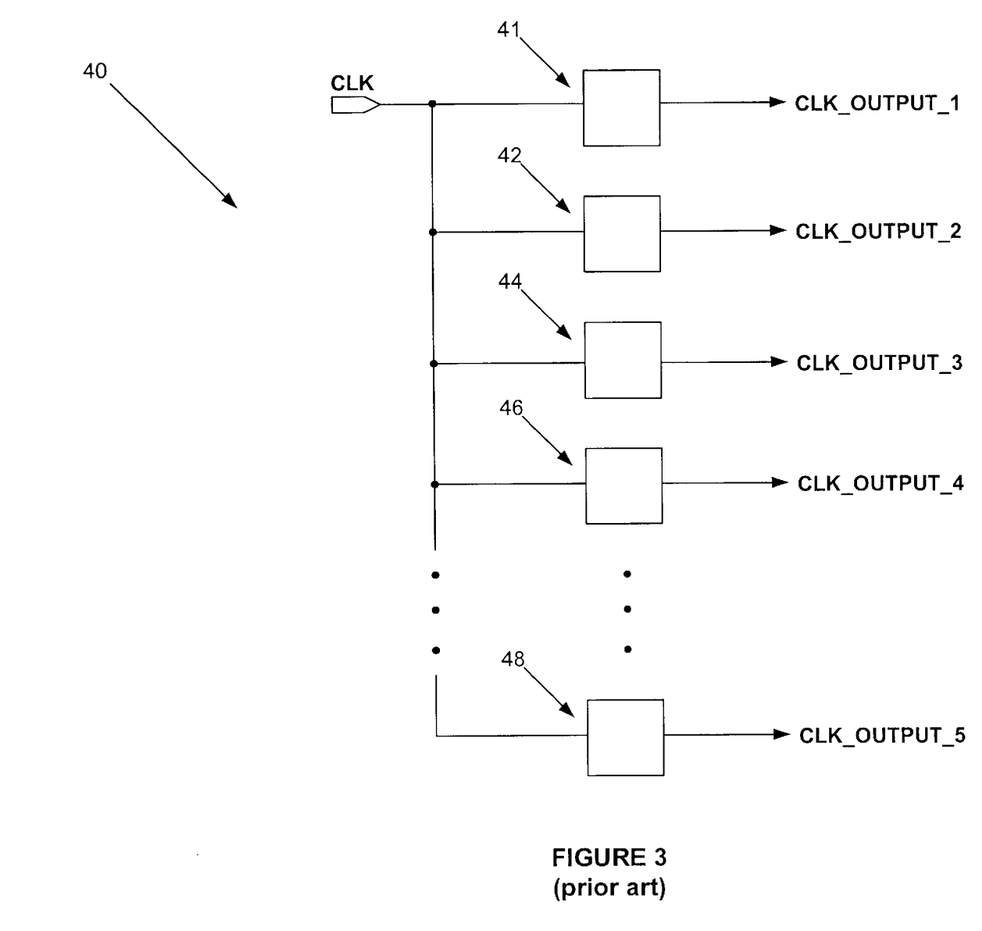
FIG. 3 shows a clock distribution scheme.

FIG. 3 shows a block diagram of a clock distribution scheme (40). The clock distribution scheme (40) includes a clock input, CLK, and n buffers (41, 42, 44, 46, 48) where n depends on the amount of clock buffers needed in a particular system. Typically, each buffer (41, 42, 44, 46, 48) outputs to a circuit that uses the clock output (CLK_OUTPUT_1, CLK_OUTPUT_2, CLK_OUTPUT_3, CLK_OUTPUT_4, CLK_OUTPUT_5) as an input. The clock distribution scheme (40) is desired in order to ensure that different circuits that use a clock signal as an input each get a full clock input signal as opposed to a clock signal that has stray voltages or is dissipated due to a poor clock distribution scheme that does not use buffers to strengthen the clock signal.

SUMMARY OF INVENTION

In one aspect, an output stage of a dynamic circuit comprises a first node that is triggered by a rising edge of an input signal, a second node that is triggered by a falling edge of the input signal, a first driver device that inputs a value on the first node, and a second driver device that inputs a value on the second node.

In another aspect, a dynamic circuit comprises a first control input stage that selectively triggers a first node on a rising edge of an input signal, a second control input stage that selectively triggers a second node on a falling edge of the input signal, and an output stage that generates an output signal based on values on the first and second nodes.

In another aspect, a method for an output stage of a dynamic circuit comprises inputting a first node to a first driver device, inputting a second node to a second driver device, selectively triggering the first node on a rising edge of an input signal, selectively triggering the second node on a falling edge of the input signal, and generating an output signal based on the first and second driver devices.

In another aspect, a method for performing dynamic circuit operations comprises inputting an input signal to a first control input stage that selectively controls a first node, inputting the input signal to a second control input stage that selectively controls a second node, selectively triggering the first node on a rising edge of the input signal, selectively triggering the second node on a falling edge of the input signal, and generating an output signal from an output stage dependent on the first and second nodes.

Other aspects and advantages of the invention will be apparent from the following description and the appended claims.

DETAILED DESCRIPTION

The present invention relates to a method and apparatus for performing logic operations using dual-edge triggered dynamic logic families. The dual-edge triggered dynamic logic families may be used for a plurality of logic functions. The present invention also relates to a method for performing logic operations using a self-resetting mechanism within dual-edge triggered dynamic logic blocks to increase logic speed. The present invention also relates to an apparatus for a dual-edge triggered dynamic circuit. The method further relates to providing a buffer mechanism for clock distribution purposes.

An embodiment of the present invention uses separate gate inputs for PMOS and NMOS driver transistors. The nodes are then pulsed when an input changes causing an output to change. Once the output has changed, the value at the output is fed back to reset the driver transistors and make them ready for the next input transition.

Figure 4:
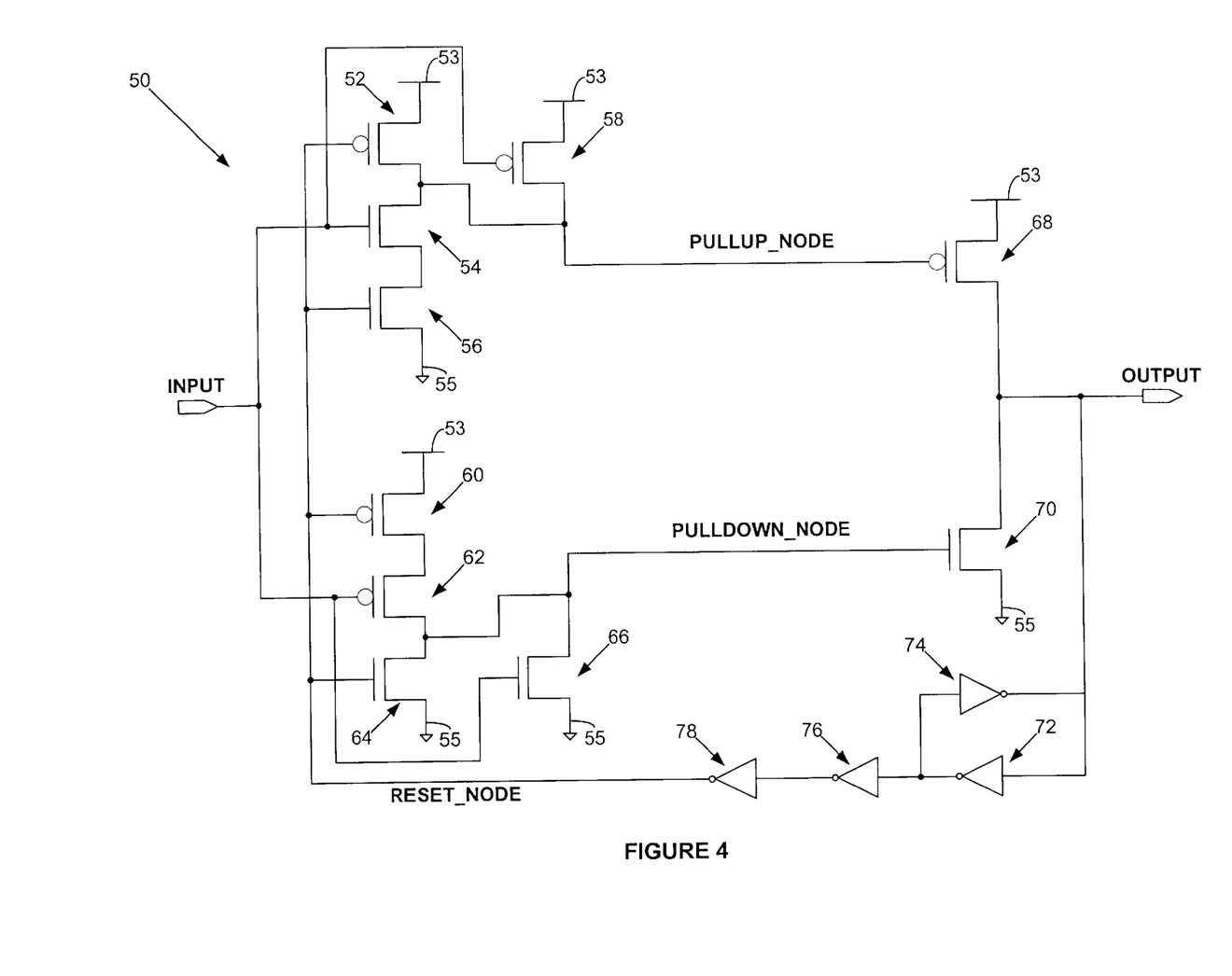
FIG. 4 shows a dual-edge triggered dynamic circuit in accordance with an embodiment of the present invention.

FIG. 4 shows circuit logic in accordance with an exemplary embodiment of the present invention. The circuit in FIG. 4 is a dual-edge triggered self-resetting buffer circuit (50) that is triggered by both falling edges and rising edges at its input. The dual-edge triggered self-resetting buffer circuit (50) includes an input, INPUT, which serves as an input to a first NMOS transistor (54), a first PMOS transistor (58), a second NMOS transistor (66), and a second PMOS transistor (62). The first NMOS transistor (54) has a terminal connected to both a terminal of a third PMOS transistor (52) and a node, PULLUP_NODE, and has another terminal connected to a terminal of a third NMOS transistor (56). The third NMOS transistor (56), in addition to having a terminal connected to a terminal of the first NMOS transistor (54), has another terminal connected to ground (55) (also referred to as "connected to low"). The third PMOS transistor (52), in addition to having a terminal connected to a terminal of the first NMOS transistor (54), has another terminal connected to a voltage source (53) (also referred to as "connected to high"). The first PMOS transistor (58) has a terminal connected to high (53) and has another terminal connected to PULLUP_NODE. Moreover, the first PMOS transistor (58), the first NMOS transistor (54), the third PMOS transistor (52), and the third NMOS transistor (56) form a "first control input stage."

The second PMOS transistor (62) has a terminal connected to both a terminal of a fourth NMOS transistor (64) and a node, PULLDOWN_NODE, and has another terminal connected to a terminal of a fourth PMOS transistor (60). The fourth PMOS transistor (60), in addition to having a terminal connected to a terminal of the second PMOS transistor (62), has another terminal connected to high (53). The fourth NMOS transistor (64), in addition to having a terminal connected to a terminal of the second PMOS transistor (62), has another terminal connected to low (55). The second NMOS transistor (66) has a terminal connected to PULLDOWN_NODE and another terminal connected to low (55). Moreover, the second PMOS transistor (62), the second NMOS transistor (66), the fourth PMOS transistor (60), and the fourth NMOS transistor (64) form a "second control input stage."

PULLUP_NODE serves as an input to a fifth PMOS transistor (68). The fifth PMOS transistor (68) has a terminal connected to high (53) and another terminal connected to both the output of the dual-edge triggered self-resetting buffer circuit (50), OUTPUT, and a terminal of a fifth NMOS transistor (70). PULLDOWN_NODE serves as input to the fifth NMOS transistor (70). The fifth NMOS transistor (70), in addition to having a terminal connected to both OUTPUT and a terminal of the fifth PMOS transistor (68), has another terminal connected to low (55). PULLUP_NODE, PULLDOWN_NODE, the fifth PMOS transistor (68), the fifth NMOS transistor (70), and OUTPUT form an "output stage" of the dual-edge triggered self-resetting buffer circuit (50). Moreover, the fifth PMOS and NMOS transistors (68, 70) are also referred to as "driver devices."

The value of OUTPUT serves as an input to a first inverter (72). The first inverter (72) outputs to both a second inverter (74) and a third inverter (76). The second inverter (74) outputs to OUTPUT and the input of the first inverter (72). The third inverter (76) outputs to a fourth inverter (78), which outputs to a node, RESET_NODE.

RESET_NODE serves as an input to the third PMOS transistor (52), the third NMOS transistor (56), the fourth PMOS transistor (60), and the fourth NMOS transistor (64). Moreover, the first inverter (72), the third inverter (76), and the fourth inverter (78) form a "reset stage" of the dual-edge triggered self-resetting buffer circuit (50).

In this embodiment, the first control input stage selectively controls PULLUP_NODE, the second control input stage selectively controls PULLDOWN_NODE, and the reset stage selectively controls RESET_NODE.

Those skilled in the art will appreciate that the transistors (52, 54, 56, 58, 60, 62, 64, 66, 68, 70) shown in FIG. 4 may be selectively sized to effectuate particular functional behavior.

Figure 5:
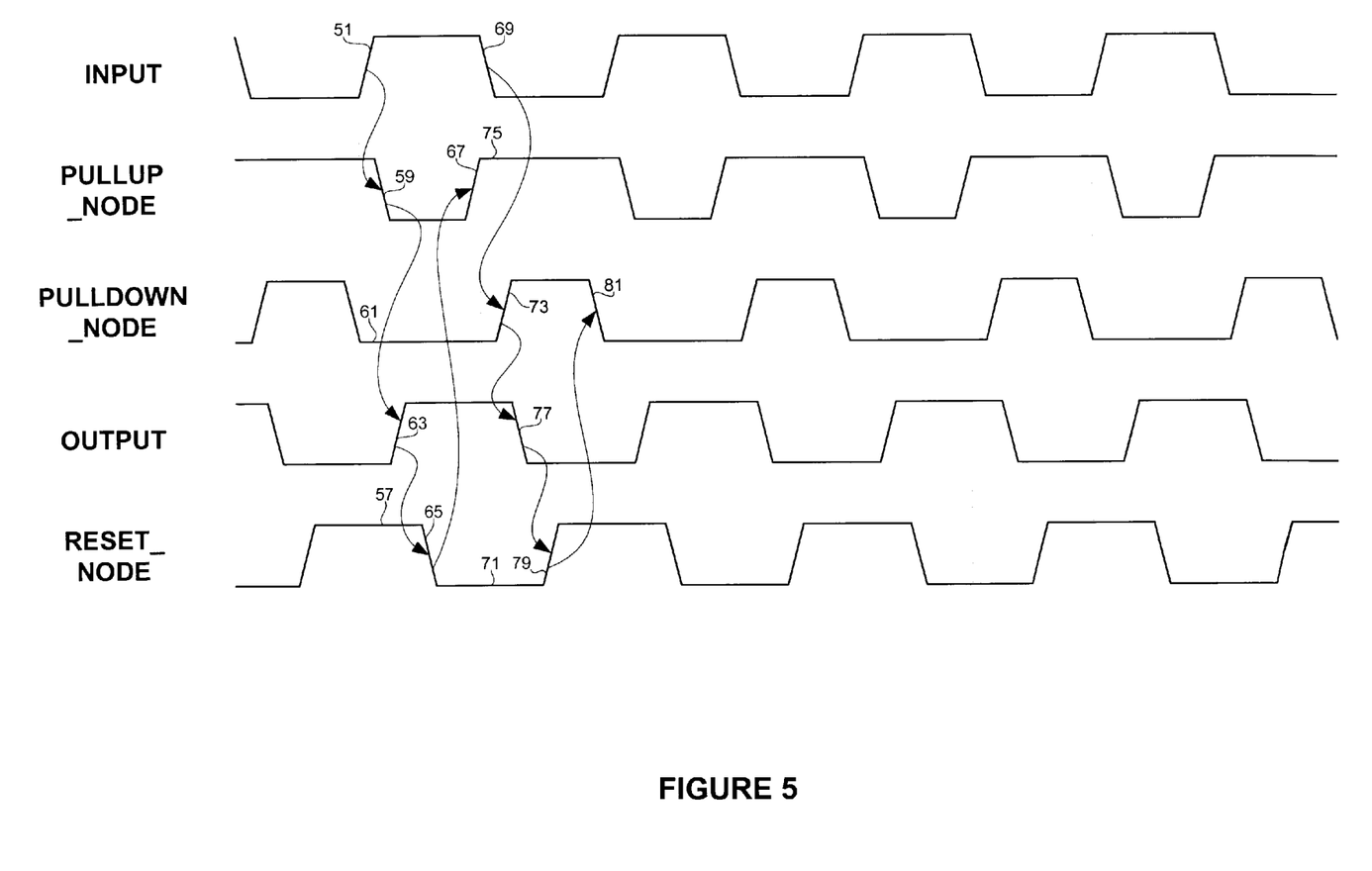
FIG. 5 shows an exemplary timing diagram in accordance with the embodiment shown in FIG. 4.

FIG. 5 shows an exemplary timing diagram of a function of the circuit shown in FIG. 4. In this exemplary embodiment, INPUT is a clock signal. Those skilled in the art will appreciate that in other embodiments, INPUT may be a different type of signal.

In one situation shown in FIG. 5, when INPUT goes high (51), the first NMOS transistor (54) switches 'on,' the first PMOS transistor (58) switches 'off,' the second PMOS transistor (62) switches 'off,' and the second NMOS transistor (66) switches 'on.' Further, as shown in FIG. 5, RESET_NODE is already high (57) when INPUT goes high (51), and therefore, at the rising edge of INPUT (51), the third PMOS transistor (52) is switched 'off,' the third NMOS transistor (56) is switched 'on,' the fourth PMOS transistor (60) is switched 'off,' and the fourth NMOS transistor (64) is switched 'on.'

Because the first NMOS transistor (54) switches 'on' due to INPUT going high (51) and because the third NMOS transistor (56) is already switched 'on' due to RESET_NODE being high (57), PULLUP_NODE goes low (59). Moreover, PULLDOWN_NODE is already low (61) because the fourth NMOS transistor (64) was already switched 'on' due to RESET_NODE being high (57) before INPUT goes high (51).

As PULLUP_NODE goes low (59), the fifth PMOS transistor (68) switches 'on,' which, in turn, causes OUTPUT to go high (63) due to OUTPUT getting connected to high (53) through the fifth PMOS transistor (68). Moreover, because PULLDOWN_NODE is low (61), the fifth NMOS transistor (70) does not switch 'on.' Thus, when INPUT goes high (51) and RESET_NODE is high (57), OUTPUT follows high (63) with a slight delay to propagation delays inherent in logic switching.

Because OUTPUT goes high (63), the input to the first inverter (72) gets connected to high (53). The first inverter (72) then outputs low to the inputs of the second inverter (74) and the third inverter (76). The second inverter (74) outputs high and holds OUTPUT high until OUTPUT is driven to a different voltage. This is necessary because OUTPUT is only driven during falling and rising edges, and therefore, the configuration of the first inverter (72) and the second inverter (74) provides a mechanism by which OUTPUT is held between edges. Furthermore, those skilled in the art will appreciate that the first and second inverter (72, 74) are sized such that they are strong enough to hold the value at OUTPUT, but not strong enough to hold OUTPUT when OUTPUT is driven by a connection to high (53) or ground (55) through the fifth PMOS transistor (68) or the fifth NMOS transistor (70), respectively.

The third inverter (76) outputs high to the input of the fourth inverter (78), which, in turn, outputs low on RESET_NODE. Thus, when OUTPUT goes high (63), RESET_NODE follows low (65) after a slight delay due to propagation delays inherent in logic switching.

When RESET_NODE goes low (65), the third PMOS transistor (52) switches 'on,' the third NMOS transistor (56) switches 'off,' the fourth PMOS transistor (60) switches 'on,' and the fourth NMOS transistor (64) switches 'off.' Because the third PMOS transistor (52) switches 'on' and the third NMOS transistor (56) switches 'off,' PULLUP_NODE goes high (67), i.e., is reset back to high, due to it getting connected to high (53) through the third PMOS transistor (52).

In summary of this situation, when INPUT goes high (51) and RESET_NODE is high (57), PULLDOWN_NODE remains low (61) from a time before INPUT goes high (51), PULLUP_NODE goes from high to low (59), OUTPUT goes from low to high (63), and RESET_NODE goes from high to low (65). Moreover, when RESET_NODE goes low (65), PULLUP_NODE is reset back to high (67).

In an alternative situation shown in FIG. 5, when INPUT goes low (69), the first NMOS transistor (54) switches 'off,' the first PMOS transistor (58) switches 'on,' the second PMOS transistor (62) switches 'on,' and the second NMOS transistor (66) switches 'off.' Further, as shown in FIG. 5, RESET_NODE is already low (71) when INPUT goes low (69), and therefore, at the falling edge of INPUT (69), the third PMOS transistor (52) is switched 'on,' the third NMOS transistor (56) is switched 'off,' the fourth PMOS transistor (60) is switched 'on,' and the fourth NMOS transistor (64) is switched 'off.'

Because the second PMOS transistor (62) switches 'on' due to INPUT going low (69) and because the fourth PMOS transistor (60) is already switched 'on' due to RESET_NODE being low (71), PULLDOWN_NODE goes high (73). Moreover, PULLUP_NODE is already high (75) because the third PMOS transistor (52) was already switched 'on' due to RESET_NODE being low (71) before INPUT goes low (69).

As PULLDOWN_NODE goes high (73), the fifth NMOS transistor (70) switches 'on,' which, in turn, causes OUTPUT to go low (77) due to OUTPUT getting connected to ground (55) through the fifth NMOS transistor (70). Moreover, because PULLUP_NODE is high (67), the fifth PMOS transistor (68) does not switch 'on.' Thus, when INPUT goes low (69) and RESET_NODE is low (71), OUTPUT follows low (77) with a slight delay to propagation delays inherent in logic switching.

Because OUTPUT goes low (77), the input to the first inverter (72) gets connected to ground (55). The first inverter (72) then outputs high to the inputs of the second inverter (74) and the third inverter (76). The second inverter (74) outputs low and holds OUTPUT low until OUTPUT is driven to a different voltage. This is necessary because OUTPUT is only driven during falling and rising edges, and therefore, the configuration of the first inverter (72) and the second inverter (74) provides a mechanism by which OUTPUT is held between edges. Furthermore, those skilled in the art will appreciate that the first and second inverter (72, 74) are sized such that they are strong enough to hold the value at OUTPUT, but not strong enough to hold OUTPUT when OUTPUT is driven by a connection to high (53) or ground (55) through the fifth PMOS transistor (68) or the fifth NMOS transistor (70), respectively.

The third inverter (76) outputs low to the input of the fourth inverter (78), which, in turn, outputs high on RESET_NODE. Thus, when OUTPUT goes low (77), RESET_NODE follows high (79) after a slight delay due to propagation delays inherent in logic switching.

When RESET_NODE goes high (79), the third PMOS transistor (52) switches 'off' the third NMOS transistor (56) switches 'on,' the fourth PMOS transistor (60) switches 'off,' and the fourth NMOS transistor (64) switches 'on.' Because the fourth PMOS transistor (60) switches 'off' and the fourth NMOS transistor (64) switches 'on,' PULLDOWN_NODE goes low (81), i.e., is reset back to low, due to it getting connected to ground (55) through the fourth NMOS transistor (64).

In summary of this situation, when INPUT goes low (69) and RESET_NODE is low (71), PULLUP_NODE remains high (75) from a time before INPUT goes low (69), PULLDOWN_NODE goes from low to high (73), OUTPUT goes from high to low (77), and RESET_NODE goes from low to high (79). Moreover, when RESET_NODE goes high (79), PULLDOWN_NODE is reset back to low (81).

Those skilled in the art will appreciate that situations other than the ones discussed may occur. Further, those skilled in the art will appreciate that the behavior of RESET_NODE ensures that the transistors in the first and second control input stages are readied for a next transition at INPUT.

As shown in FIG. 5, OUTPUT is triggered by both rising and falling edges at INPUT. Additionally, those skilled in the art will appreciate that the duty cycle of the signal at INPUT is maintained at OUTPUT. Those skilled in the art will also appreciate that the behavior of PULLUP_NODE, PULLDOWN_NODE, and RESET_NODE allows for a self-resetting mechanism that makes the dual-edge triggered self-resetting buffer circuit (50) operationally faster than static circuits.

Figure 6:
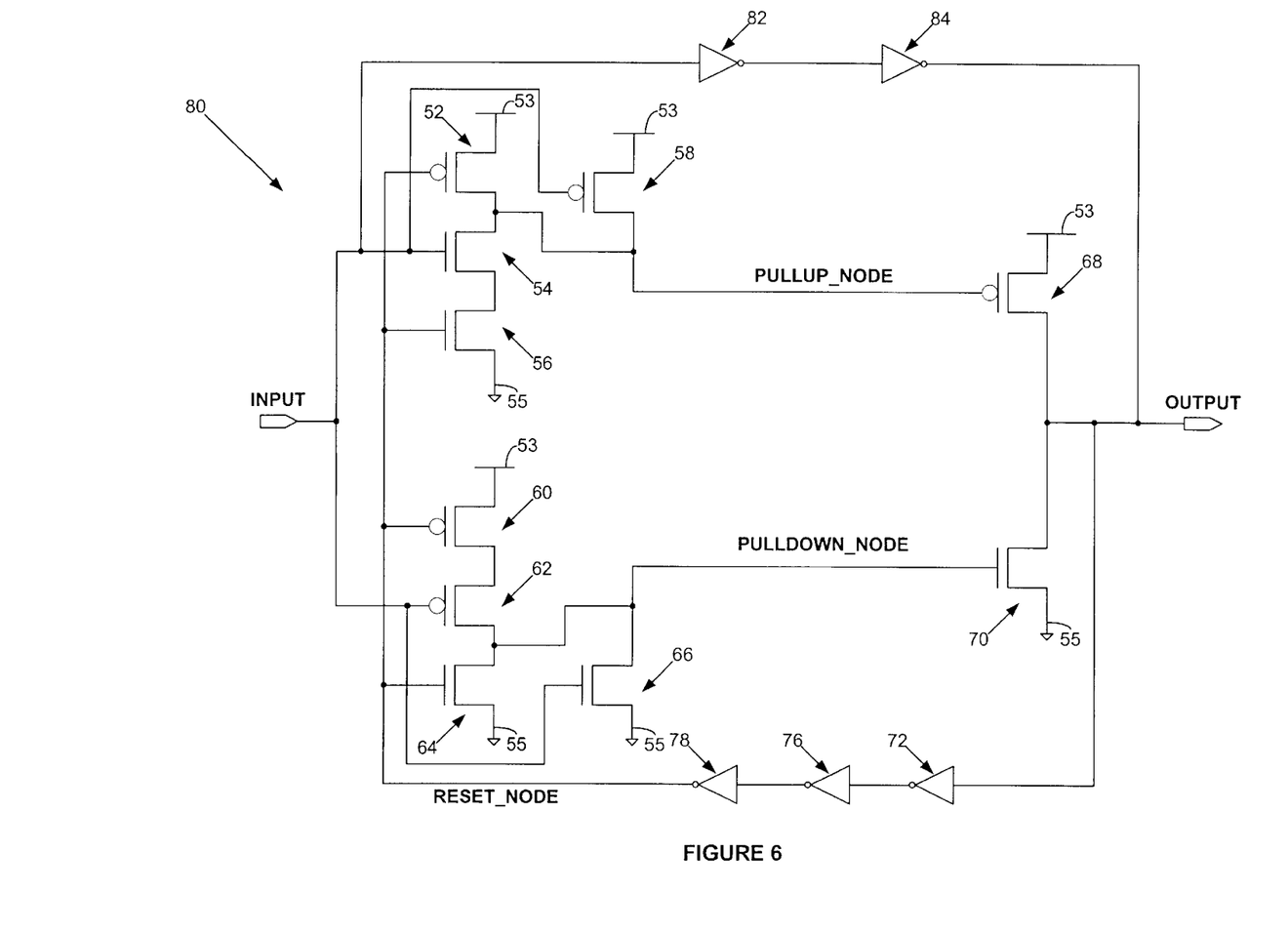
FIG. 6 shows a dual-edge triggered dynamic circuit in accordance with another embodiment of the present invention.

Referring to FIG. 4 and FIG. 6, wherein like reference characters are used for like parts throughout the several views, FIG. 6 shows another dual-edge triggered self-resetting buffer circuit (80) that is triggered by rising and falling edges in accordance with an exemplary embodiment of the present invention. Although the configuration of INPUT, OUTPUT, PULLUP_NODE, PULLDOWN_NODE, RESET_NODE, the NMOS transistors (54, 56, 64, 66, 70), the PMOS transistors (52, 58, 60, 62, 68), and three inverters (72, 76, 78) is similar in both FIG. 4 and FIG. 6, the configuration of the inverters that hold OUTPUT is different in the two exemplary embodiments.

In FIG. 6, INPUT serves as an input to a fifth inverter (82), which, in turn outputs to a sixth inverter (84). The sixth inverter (84) outputs to OUTPUT and ensures that OUTPUT either stays high or low until OUTPUT is driven to a different voltage either through a connection through the fifth PMOS transistor (68) or through the fifth NMOS transistor (70). This is necessary because OUTPUT is only driven between falling and rising edges, and therefore, the configuration of the fifth inverter (82) and the sixth inverter (84) holds the value of OUTPUT between edges. Those skilled in the art will appreciate that the fifth and sixth inverters (82, 84) are sized such that they are strong enough to hold the value of OUTPUT but not strong enough to hold OUTPUT when OUTPUT is driven by either the fifth PMOS transistor (68) or the fifth NMOS transistor (70).

Figure 7:
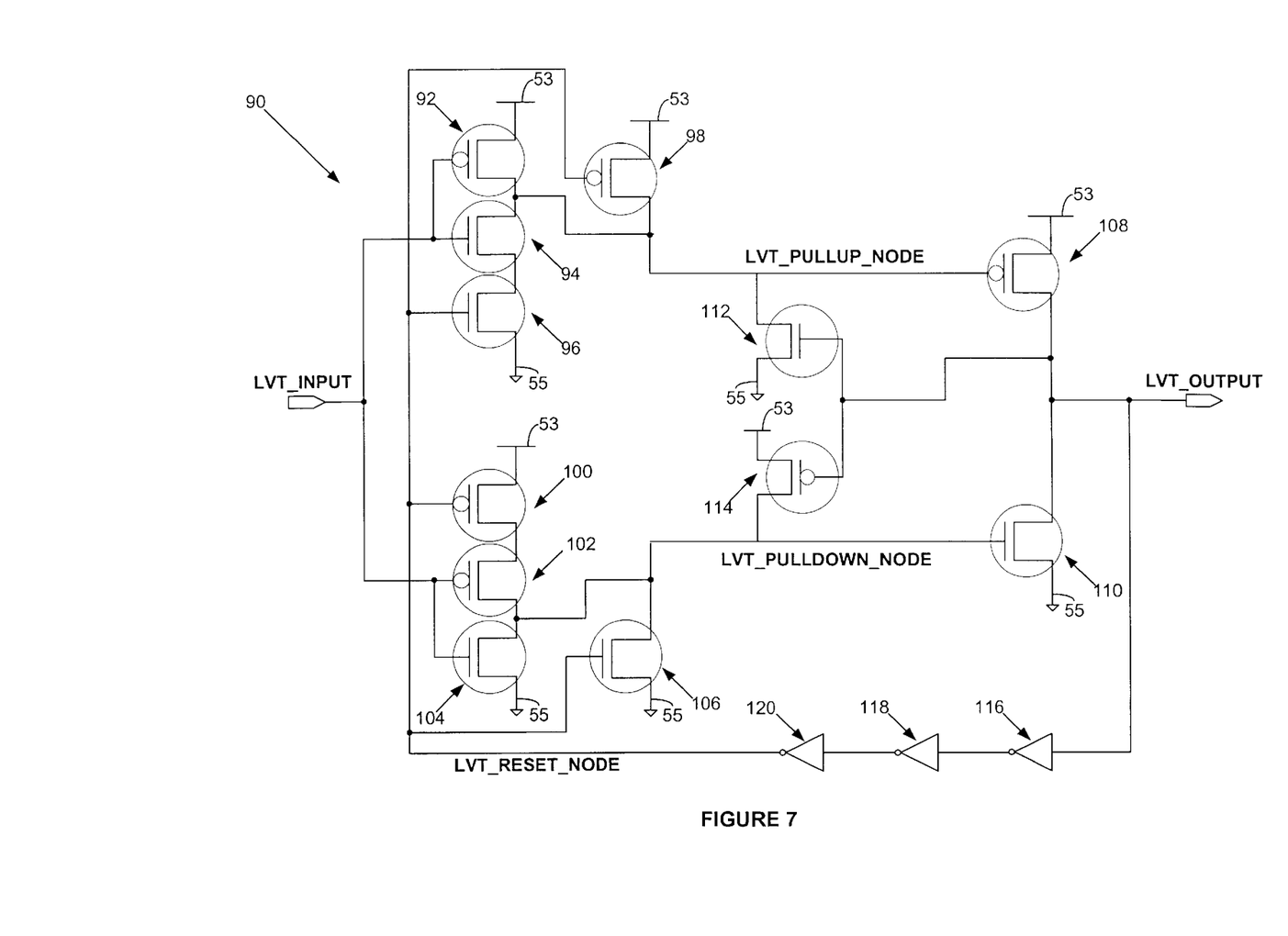
FIG. 7 shows a dual-edge triggered dynamic circuit in accordance with another embodiment of the present invention.

Referring to FIG. 7, a dual-edge triggered self-resetting low voltage threshold ("LVT") buffer circuit (90) that is triggered by rising and falling edges is shown in accordance with an exemplary embodiment of the present invention. The dual-edge triggered self-resetting LVT buffer circuit (90) uses LVT PMOS and NMOS transistors.

The dual-edge triggered self-resetting LVT buffer circuit (90) includes an input, LVT_INPUT, which serves as an input to a first LVT PMOS transistor (92), a first LVT NMOS transistor (94), a second LVT PMOS transistor (102), and a second LVT NMOS transistor (104). The first LVT PMOS transistor (92) has a terminal connected to high (53) and another terminal connected to both a terminal of the first LVT NMOS transistor (94) and a node, LVT_PULLUP_NODE. The first LVT NMOS transistor (94), in addition to having a terminal connected to a terminal of the first LVT PMOS transistor (92), has another terminal connected to a terminal of a third LVT NMOS transistor (96). The third LVT NMOS transistor (96), in addition to having a terminal connected to a terminal of the first LVT NMOS transistor (94), has a terminal connected to ground (55). Moreover, the first LVT PMOS transistor (92), the first LVT NMOS transistor (94), the third LVT NMOS transistor (96), and a sixth LVT PMOS transistor (98) (discussed below) form a "first control input stage."

The second LVT PMOS transistor (102) has a terminal connected to a third LVT PMOS transistor (100) and has another terminal connected to both a terminal of the second LVT NMOS transistor (104) and a node, LVT_PULLDOWN_NODE. The third LVT PMOS transistor (100), in addition to having a terminal connected to a terminal of the second LVT PMOS transistor (102), has a terminal connected to high (53). The second LVT NMOS transistor (104), in addition to having a terminal connected to the second LVT PMOS transistor (102), has a terminal connected to ground (55). Moreover, the second LVT PMOS transistor (102), the second LVT NMOS transistor (104), the third LVT PMOS transistor (100), and a sixth LVT NMOS transistor (106) (discussed below) form a "second control input stage."

LVT_PULLUP_NODE serves as an input to a fourth LVT PMOS transistor (108). The fourth LVT PMOS transistor (108) has a terminal connected to high (53) and another terminal that is connected to inputs of a fifth LVT NMOS transistor (112) and a fifth LVT PMOS transistor (114), a terminal of a fourth LVT NMOS transistor (110), and to the dual-edge self-resetting LVT buffer circuit (90) output, LVT_OUTPUT. LVT_PULLDOWN_NODE serves as an input to the fourth LVT NMOS transistor (110). The fourth LVT NMOS transistor (110) has a terminal connected to ground (55) and another terminal that, in addition to being connected to a terminal of the fourth LVT PMOS transistor (108), is connected to LVT_OUTPUT and to inputs of the fifth LVT NMOS transistor (112) and the fifth LVT PMOS transistor (114). Moreover, LVT_PULLUP_NODE, LVT_PULLDOWN_NODE, the fourth LVT PMOS transistor (108), the fourth LVT NMOS transistor (110), the fifth LVT PMOS transistor (114), and the fifth LVT NMOS transistor (112) form an "output stage" of the dual-edge triggered self-resetting LVT buffer circuit (90). Moreover, the fourth PMOS and NMOS transistors (108, 110) are also referred to as "driver devices."

The dual-edge triggered self-resetting LVT buffer circuit (90) also includes a first LVT inverter (116), which has an input connected to LVT_OUTPUT. The first LVT inverter (116) outputs to a second LVT inverter (118), which, in turn, outputs to a third LVT inverter (120). The third LVT inverter (120) outputs on LVT_RESET_NODE. LVT_RESET_NODE serves as an input to the sixth LVT PMOS transistor (98), the third LVT NMOS transistor (96), the third LVT PMOS transistor (100), and to the sixth LVT NMOS transistor (106). The sixth LVT PMOS transistor (98) has a terminal connected to high (53) and another terminal connected to LVT_PULLUP_NODE. The sixth LVT NMOS transistor (106) has a terminal connected to ground (55) and another terminal connected to LVT_PULLDOWN_NODE. Moreover, the first LVT inverter (116), the second LVT inverter (118), and the third LVT inverter (120) form a "reset stage" of the dual-edge triggered self-resetting LVT buffer circuit (90).

In this embodiment, the first control input stage selectively controls LVT_PULLUP_NODE, the second control input stage selectively controls LVT_PULLDOWN NODE, and the reset stage selectively controls LVT_RESET_NODE.

Those skilled in the art will appreciate that the LVT transistors (92, 94, 96, 98, 100, 102, 104, 106, 108, 110, 112, 114) shown in FIG. 7 may be selectively sized to effectuate particular functional behavior.

Figure 8:
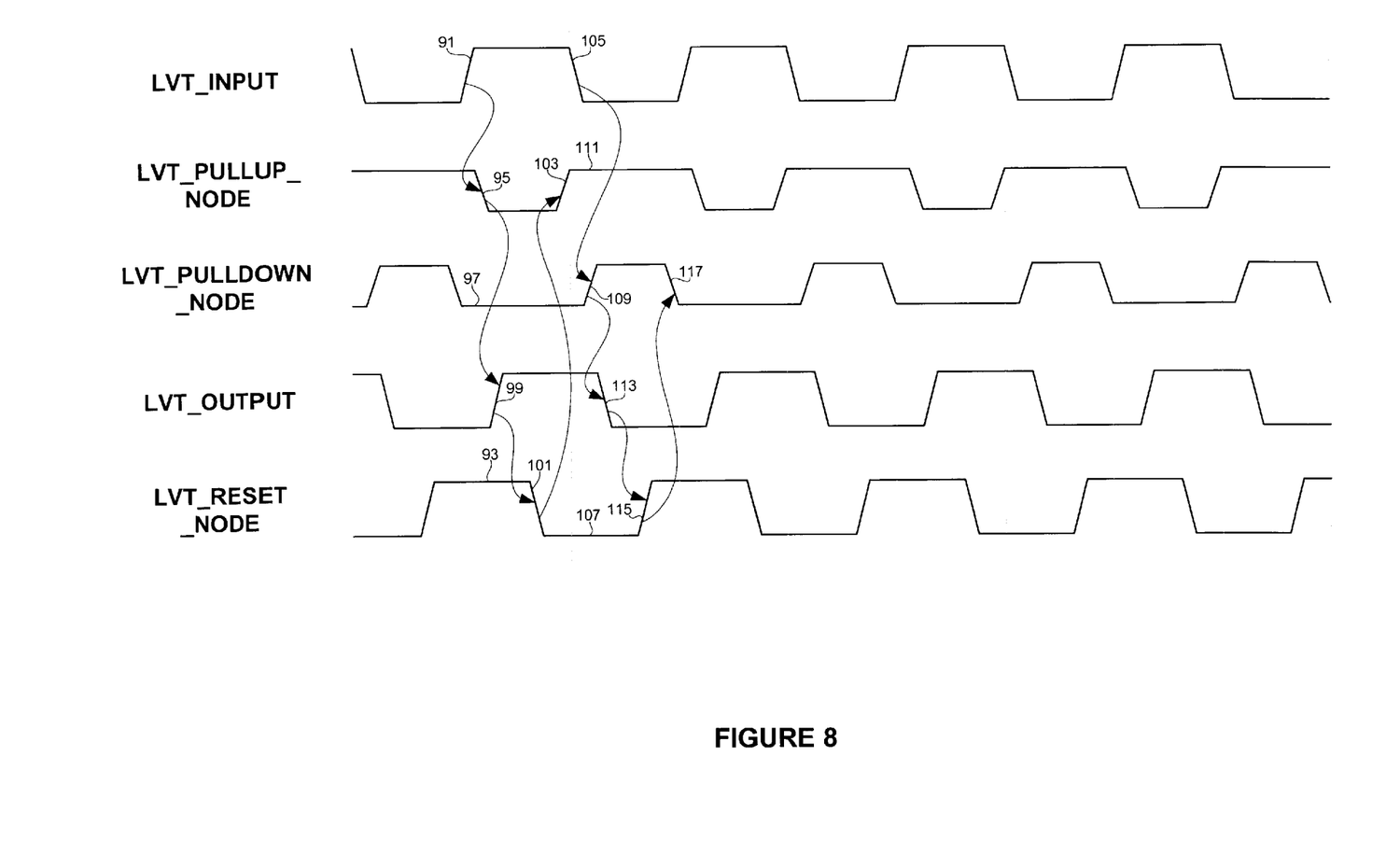
FIG. 8 shows an exemplary timing diagram in accordance with the embodiment shown in FIG. 7.

FIG. 8 is an exemplary timing diagram of a function of the circuit shown in FIG. 7 in accordance with the present invention. In this exemplary embodiment, LVT_INPUT is a clock signal. Those skilled in the art will appreciate that in other embodiments, LVT_INPUT may be a different type of signal.

In one situation shown in FIG. 8, when LVT_INPUT goes high (91), the first LVT PMOS transistor (92) switches 'off,' the first LVT NMOS transistor (94) switches 'on,' the second LVT PMOS transistor (102) switches 'off,' and the second LVT NMOS transistor (104) switches 'on.' Further, as shown in FIG. 8, LVT_RESET_NODE is already high (93) when LVT_INPUT goes high (91), and therefore, at the rising edge of LVT_INPUT (91), the third LVT NMOS transistor (96) is switched 'on,' the sixth LVT PMOS transistor (98) is switched 'off,' the third LVT PMOS transistor (100) is switched 'off,' and the sixth LVT NMOS transistor (106) is switched 'on.'

Because the first LVT NMOS transistor (94) switches 'on' due to LVT_INPUT going high (91) and because the third LVT NMOS transistor (96) is already switched 'on' due to LVT_RESET_NODE being high (93), LVT_PULLUP_NODE goes low (95). Moreover, LVT_PULLDOWN_NODE is already low (97) because the sixth LVT NMOS transistor (106) was already switched 'on' due to LVT_RESET_NODE being high (93) before LVT_INPUT goes high (91).

As LVT_PULLUP_NODE goes low (95), the fourth LVT PMOS transistor (108) switches 'on,' which, in turn, causes LVT_OUTPUT to go high (99) due to LVT_OUTPUT getting connected to high (53) through the fourth LVT PMOS transistor (108). Moreover, because LVT_PULLDOWN_NODE is low (97), the fourth LVT NMOS transistor (110) does not switch 'on.' Thus, when LVT_INPUT goes high (91) and LVT_RESET_NODE is high (93), LVT_OUTPUT follows high (99) with a slight delay due to propagation delays inherent in logic switching.

Because LVT_OUTPUT goes high (99), the input to the first inverter (116) gets connected to high (53). The first inverter (116) then outputs low to the input of the second inverter (118). The second inverter (118) outputs high to the input of the third inverter (120), which, in turn outputs low on LVT_RESET_NODE (101). Note also that the fifth LVT NMOS transistor (112) switches 'on' due to the high value of LVT_OUTPUT being connected to the input of the fifth LVT NMOS transistor (112).

When LVT_RESET_NODE goes low (101), the sixth LVT PMOS transistor (98) switches 'on,' the third LVT NMOS transistor (96) switches 'off,' the third LVT PMOS transistor (100) switches 'on,' and the sixth LVT NMOS transistor (106) switches 'off.'

Because the fifth LVT NMOS transistor (112) and the sixth LVT PMOS transistor (98) switch 'on,' they form a voltage divider configuration such that LVT_PULLUP_NODE goes partially high (103), i.e., is reset back to a partial high. Because LVT_PULLUP_NODE does not go back all the way high to the voltage source (53) value due to the voltage divider configuration of the fifth LVT NMOS transistor (112) and the sixth LVT PMOS transistor (98), the fourth LVT PMOS transistor (108) remains slightly 'on.' By allowing the fourth LVT PMOS transistor (108) to remain slightly 'on,' LVT_OUTPUT is held high by a connection to high (53) through the fourth LVT PMOS transistor (108). It is necessary to ensure that LVT_OUTPUT is held high in this case because LVT_OUTPUT is only driven during rising and falling edges, and not between edges. Thus, the configuration of the fifth LVT NMOS transistor (112) and the sixth LVT PMOS transistor (98) provides a mechanism by which OUTPUT is held between edges. Furthermore, those skilled in the art will appreciate that the fifth LVT NMOS transistor (112) is sized in relation to the first and sixth LVT PMOS transistors (92, 98) such that the fifth LVT NMOS transistor (112) is strong enough to bring LVT_PULLUP_NODE slightly lower when the sixth LVT PMOS transistor (98) is 'on,' but not strong enough to bring LVT_PULLUP_NODE slightly lower when the first LVT PMOS transistor (92) is 'on.'

In summary of this situation, when LVT_INPUT goes high (91) and LVT_RESET_NODE is high (93), LVT_PULLDOWN_NODE remains low (97) from a time before LVT_INPUT goes high (91), LVT_PULLUP_NODE goes from high to low (95), LVT_OUTPUT goes from low to high (99), and LVT_RESET_NODE goes from high to low (101). Moreover, when LVT_RESET_NODE goes low (101), LVT_PULLUP_NODE is reset back to high (103).

In an alternative situation shown in FIG. 8, when LVT_INPUT goes low (105), the first LVT PMOS transistor (92) switches 'on,' the first LVT NMOS transistor (94) switches 'off,' the second LVT PMOS transistor (102) switches 'on,' and the second LVT NMOS transistor (104) switches 'off.' Further, as shown in FIG. 8, LVT_RESET_NODE is already low (107) when LVT_INPUT goes low (105), and therefore, at the falling edge of LVT_INPUT (105), the third LVT NMOS transistor (96) is switched 'off,' the sixth LVT PMOS transistor (98) is switched 'on,' the third LVT PMOS transistor (100) is switched 'on,' and the sixth LVT NMOS transistor (106) is switched 'off.'

Because the second LVT PMOS transistor (102) switches 'on' due to LVT_INPUT going low (105) and because the third LVT PMOS transistor (96) is already switched 'on' due to LVT_RESET_NODE being low (107), LVT_PULLDOWN_NODE goes high (109). Moreover, LVT_PULLUP_NODE is already high (111) because the sixth LVT PMOS transistor (98) was already switched 'on' due to LVT_RESET_NODE being low (107) before LVT_INPUT goes low (105).

As LVT_PULLDOWN_NODE goes high (109), the fourth LVT_NMOS transistor (110) switches 'on,' which, in turn, causes LVT_OUTPUT to go low (113) due to LVT_OUTPUT getting connected to ground (55) through the fourth LVT NMOS transistor (110). Moreover, because LVT_PULLUP_NODE is high (111), the fourth LVT PMOS transistor (108) does not switch 'on.' Thus, when LVT_INPUT goes low (105) and LVT_RESET_NODE is low (107), LVT_OUTPUT follows low (113) with a slight delay to propagation delays inherent in logic switching.

Because LVT_OUTPUT goes low (113), the input to the first inverter (116) gets connected to low (55). The first inverter (116) then outputs high to the input of the second inverter (118). The second inverter (118) outputs low to the input of the third inverter (120), which, in turn outputs high on LVT_RESET_NODE (115). Note also that the fifth LVT PMOS transistor (114) switches 'on' due to the low value of LVT_OUTPUT being connected to the input of the fifth LVT PMOS transistor (114).

When LVT_RESET_NODE goes high (115), the sixth LVT PMOS transistor (98) switches 'off,' the third LVT NMOS transistor (96) switches 'on,' the third LVT PMOS transistor (100) switches 'off,' and the sixth LVT NMOS transistor (106) switches 'on.'

Because the fifth LVT PMOS transistor (114) and the sixth LVT NMOS transistor (106) switch 'on,' they form a voltage divider configuration such that LVT_PULLDOWN_NODE goes partially low (117), i.e., is reset back to a partial low. Because LVT_PULLDOWN_NODE does not go back all the way low to the ground (55) value due to the voltage divider configuration of the fifth LVT PMOS transistor (114) and the sixth LVT NMOS transistor (106), the fourth LVT NMOS transistor (110) remains slightly 'on.' By allowing the fourth LVT NMOS transistor (110) to remain slightly 'on,' LVT_OUTPUT is held low by a connection to ground (55) through the fourth LVT NMOS transistor (110). It is necessary to ensure that LVT_OUTPUT is held low in this case because LVT_OUTPUT is only driven during rising and falling edges, and not between edges. Thus, the configuration of the fifth LVT PMOS transistor (114) and the sixth LVT NMOS transistor (106) provides a mechanism by which OUTPUT is held between edges. Furthermore, those skilled in the art will appreciate that the fifth LVT PMOS transistor (114) is sized in relation to the second and sixth LVT NMOS transistors (104, 106) such that the fifth LVT PMOS transistor (114) is strong enough to bring LVT_PULLDOWN_NODE slightly higher when the sixth LVT NMOS transistor (106) is 'on,' but not strong enough to bring LVT_PULLDOWN_NODE slightly higher when the second LVT NMOS transistor (104) is 'on.'

In summary of this situation, when LVT_INPUT goes low (105) and LVT_RESET_NODE is low (107), LVT_PULLUP_NODE remains high (111) from a time before LVT_INPUT goes low (105), LVT_PULLDOWN_NODE goes from low to high (109), LVT_OUTPUT goes from high to low (113), and LVT_RESET_NODE goes from low to high (115). Moreover, when LVT_RESET_NODE goes high (115), LVT_PULLDOWN_NODE is reset back to low (117).

Those skilled in the art will appreciate that situations other than the ones discussed may occur. Further, those skilled in the art will appreciate that the behavior of LVT_RESET_NODE ensures that the transistors in the first and second control input stages are readied for a next transition at LVT_INPUT.

Figure 9:
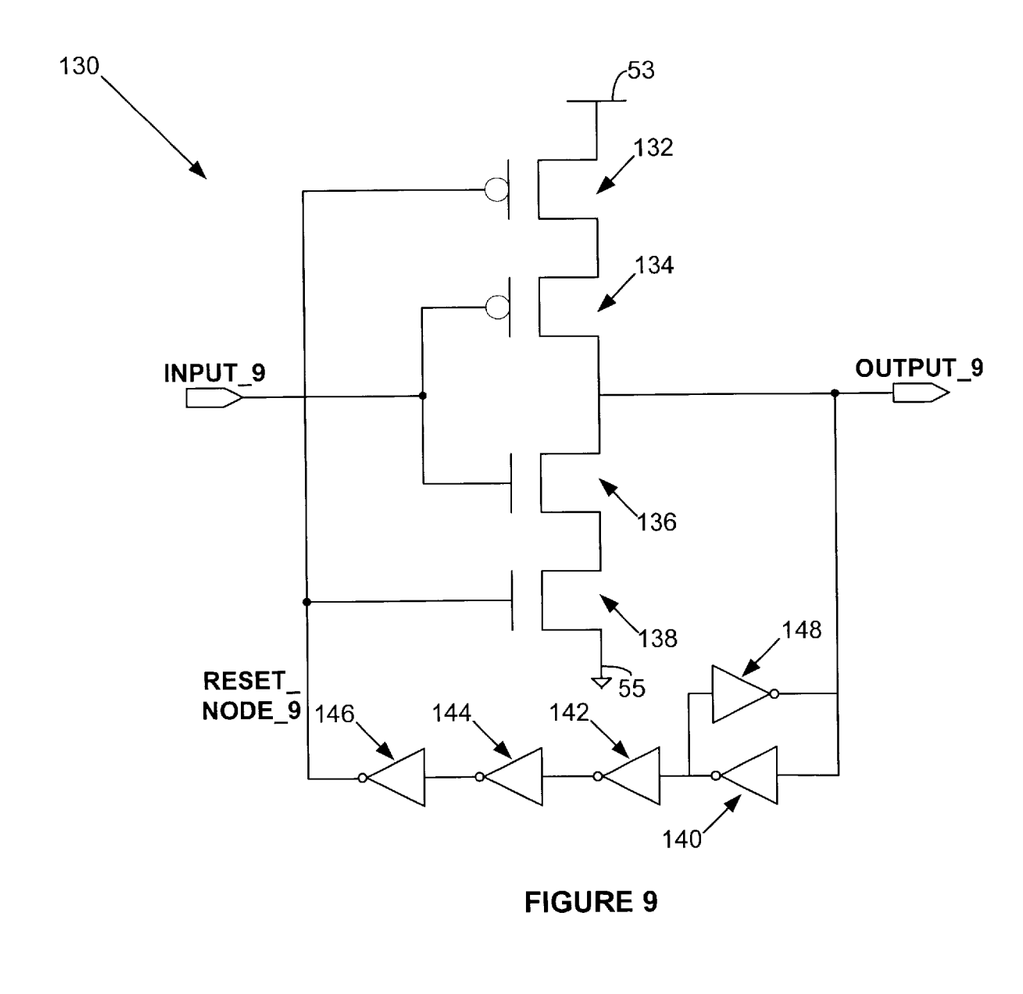
FIG. 9 shows a dual-edge triggered dynamic circuit in accordance with another embodiment of the present invention.

Referring to FIG. 9, an another exemplary embodiment of a dual-edge triggered self-resetting circuit (130) is shown in accordance with the present invention.

The dual-edge triggered self-resetting circuit (130) includes an input, INPUT_9, which serves as an input to a first PMOS transistor (134) and a first NMOS transistor (136). The first PMOS transistor (134) has a terminal connected to a terminal of a second PMOS transistor (132) and has another terminal connected to a terminal of the first NMOS transistor (136), an output of the dual-edge triggered self-resetting circuit (130), OUTPUT_9, and an input to a first inverter (140). The second PMOS transistor (132), in addition to having a terminal connected to a terminal of the first PMOS transistor (134), has another terminal connected to high (53). The first NMOS transistor (136), in addition to having a terminal connected to a terminal of the first PMOS transistor (134), has another terminal connected to a terminal of a second NMOS transistor (138). The terminal of the first NMOS transistor (136) that is connected to a terminal of the first PMOS transistor (134) is also connected to OUTPUT_9 and the input to the first inverter (140). The second NMOS transistor (138), in addition to having a terminal connected to a terminal of the first NMOS transistor (136), has another terminal connected to ground (55). Moreover, the first PMOS transistor (134) and the first NMOS transistor (136) form a "first control input stage" of the dual-edge triggered self-resetting circuit (130) and the second PMOS transistor (132) and the second NMOS transistor (138) form a "second control input stage" of the dual-edge triggered self-resetting circuit (130).

The first inverter (140), which has an input connected to both a terminal of the first PMOS transistor (134) and a terminal of the second NMOS transistor (136), outputs to an input of a second inverter (142) and to an input of a fifth inverter (148). The fifth inverter (148) outputs on OUTPUT_9. The second inverter (142) outputs to an input of a third inverter (144), which, in turn, outputs to an input of a fourth inverter (146). The fourth inverter (146) outputs on RESET_NODE_9. RESET_NODE_9 serves as an input to the second control input stage, i.e., the second PMOS transistor (132) and the second NMOS transistor (138). Moreover, the first, second, third, and fourth inverters (140, 142, 144, 146) form a "reset stage" of the dual-edge triggered self-resetting circuit (130) shown in FIG. 9.

Those skilled in the art will appreciate that the transistors (132, 134, 136, 138) shown in FIG. 9 may be selectively sized to effectuate particular functional behavior.

Figure 10:
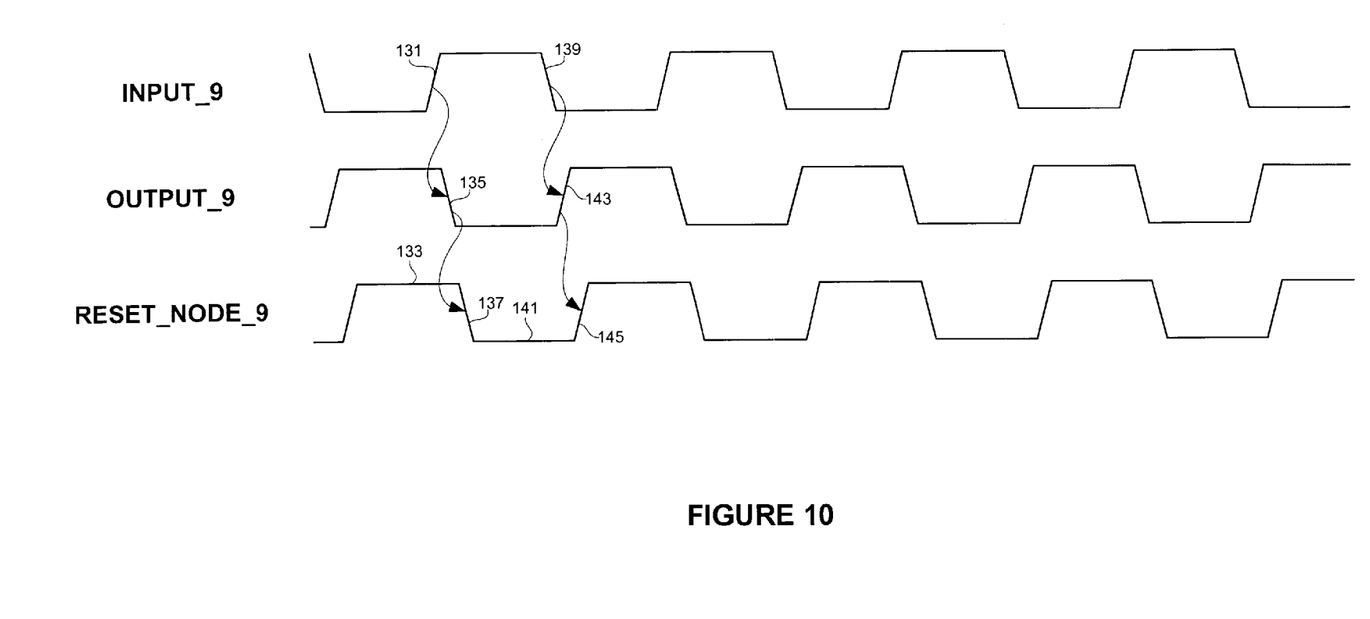
FIG. 10 shows an exemplary timing diagram in accordance with the embodiment shown in FIG. 9.

FIG. 10 is an exemplary timing diagram of a function of the circuit shown in FIG. 9 in accordance with the present invention. In this exemplary embodiment, INPUT_9 is a clock signal. Those skilled in the art will appreciate that in other embodiments, INPUT_9 may be a different type of signal.

In one situation shown in FIG. 10, when INPUT_9 goes high (131), the first PMOS transistor (134) switches 'off' and the first NMOS transistor (136) switches 'on.' Further, as shown in FIG. 10, RESET_NODE_9 is already high (133) when INPUT_9 goes high (131), and therefore, at the rising edge of INPUT_9 (131), the second PMOS transistor (132) is switched 'off' and the second NMOS transistor (138) is switched 'on.'

Because the first NMOS transistor (136) switches 'on' due to the rising edge at INPUT_9 (131) and because the second NMOS transistor (138) is switched 'on' due to RESET_NODE_9 already being high (133), OUTPUT_9 goes low (135) due to it getting connected to ground (55) through the first and second NMOS transistors (136, 138).

The low value at OUTPUT_9 serves as an input to the first inverter (140), which, in turn, outputs high to the inputs of the second and fifth inverters (142, 148). The fifth inverter (148) then outputs low back on OUTPUT_9 to ensure that OUTPUT_9 is held low. This is necessary because OUTPUT_9 is only driven during rising and falling edges, and therefore, the configuration of the first and fifth inverter (140, 148) ensures that OUTPUT_9 is held between edges. Further, those skilled in the art will appreciate that the fifth inverter (148) is strong enough to hold OUTPUT_9 between edges, but it is not strong enough to hold OUTPUT_9 when OUTPUT_9 is driven by a connection through either the first and second PMOS transistors (134, 132) or the first and second NMOS transistors (136, 138).

The second inverter (142) outputs low to the input of the third inverter (144), which, in turn, outputs high to the input of the fourth inverter (146). The fourth inverter (146), in turn, outputs low on RESET_NODE_9. When RESET_NODE_9 goes low (137), the second PMOS transistor (132) switches 'on' and the second NMOS transistor (138) switches 'off.'

In summary of this situation, when INPUT_9 goes high (131) and RESET_NODE_9 is high (133), OUTPUT_9 goes from high to low (135), and RESET_NODE_9 goes from high to low (137).

In an alternative situation shown in FIG. 10, when INPUT_9 goes low (139), the first PMOS transistor (134) switches 'on' and the first NMOS transistor (136) switches 'off.' Further, as shown in FIG. 10, RESET_NODE_9 is already low (141) when INPUT_9 goes low (139), and therefore, at the falling edge of INPUT_9 (139), the second PMOS transistor (132) is switched 'on' and the second NMOS transistor (138) is switched 'off.'

Because the first PMOS transistor (134) switches 'on' due to the falling edge at INPUT_9 (139) and because the second PMOS transistor (132) is switched 'on' due to RESET_NODE_9 already being low (141), OUTPUT_9 goes high (143) due to it getting connected to high (53) through the first and second PMOS transistors (134, 132).

The high value at OUTPUT_9 serves as an input to the first inverter (140), which, in turn, outputs low to the inputs of the second and fifth inverters (142, 148). The fifth inverter (148) then outputs high back on OUTPUT_9 to ensure that OUTPUT_9 is held high. This is necessary because OUTPUT_9 is only driven during rising and falling edges, and therefore, the configuration of the first and fifth inverter (140, 148) ensures that OUTPUT_9 is held between edges. Further, those skilled in the art will appreciate that the fifth inverter (148) is strong enough to hold OUTPUT_9 between edges, but it is not strong enough to hold OUTPUT_9 when OUTPUT_9 is driven by a connection through either the first and second PMOS transistors (134, 132) or the first and second NMOS transistors (136, 138).

The second inverter (142) outputs high to the input of the third inverter (144), which, in turn, outputs low to the input of the fourth inverter (146). The fourth inverter (146), in turn, outputs high on RESET_NODE_9. When RESET_NODE_9 goes high (145), the second PMOS transistor (132) switches 'off' and the second NMOS transistor (138) switches 'on.'

In summary of this situation, when INPUT_9 goes low (139) and RESET_NODE_9 is low (141), OUTPUT_9 goes from low to high (143), and RESET_NODE_9 goes from low to high (145).

Those skilled in the art will appreciate that situations other than the ones discussed may occur. Further, those skilled in the art will appreciate that the behavior of RESET_NODE_9 ensures that the transistors in the first and second control input stages are readied for a next transition at INPUT_9.

Those skilled in the art will appreciate that the various embodiments of the present invention shown in FIGS. 4, 6, 7, and 9 can be implemented using either, or both, non-LVT or LVT transistors. Thus, the embodiments shown in FIGS. 4, 6, 7, and 9 are not limited to the type of transistor shown in each of the respective figures.

Advantages of the present invention may include one or more of the following. In one or more embodiments, the output to a dynamic logic circuit is driven by a driving PMOS transistor and a driving NMOS transistor that do not have a common node input. This allows for the driving transistors to be individually and selectively reset such that the circuit can be triggered by both rising and falling edges.

In some embodiments, faster performance is achieved due to the self-resetting behavior of dual-edge triggered dynamic logic.

In some embodiments, clock distribution can occur using dynamic buffering blocks without attenuation or augmentation of a clock signal's duty cycle. In other words, dual-triggered dynamic logic allows for maintaining a clock signal's duty cycle through buffering stages in a clock distribution scheme.

In some embodiments, because the driving transistors of a dual-edge triggered dynamic circuit are 'off' when an input of the dual-edge triggered dynamic circuit changes and because only one driving transistor switches 'on' during a cycle, there is no contention at an output of the dual-edge triggered dynamic circuit between the driving transistors.

In some embodiments, transistors can be sized to favor either a rising edge or falling edge based on the driver transistor that they control.

In some embodiments, higher fan-out can be achieved through the use of dual-triggered dynamic logic families.

In some embodiments, the input to a dynamic circuit is not loaded. Instead, the reset path in a dual-edge triggered dynamic circuit is loaded since buffering is provided along the reset path.

In some embodiments, transistors in the dual-edge triggered dynamic logic families can be skewed to generate or affect desired behavior and results.

While the invention has been described with respect to a limited number of embodiments, those skilled in the art will appreciate that other embodiments can be devised which do not depart from the scope of the invention as disclosed herein. Accordingly, the scope of the invention should be limited only by the attached claims.

What is claimed is:

1. An output stage of a dynamic circuit, comprising:
a first node that is triggered by a rising edge of an input signal;
a second node that is triggered by a falling edge of the input signal;
a first driver device that inputs a value on the first node; and
a second driver device that inputs a value on the second node,
wherein the first driver device and the second driver device selectively control an output of the dynamic circuit, and wherein at least one of a value on the first node and a value on the second node is dependent on the output.

2. The output stage of claim 1, wherein, depending on the output, the second node is reset to a value that the second node had before the falling edge of the input signal.

3. The output stage of claim 1, wherein, depending on the output, the first node is reset to a value that the first node had before the rising edge of the input signal.

4. The output stage of claim 1, wherein the first driver device is a first transistor, and wherein the second driver device is a second transistor.

5. A dynamic circuit, comprising:
   a first control input stage that selectively triggers a first node on a rising edge of an input signal;
   a second control input stage that selectively triggers a second node on a falling edge of the input signal;
   an output stage that generates an output signal based on values on the first and second nodes; and
   a reset stage that generates a reset signal based on the output signal.

6. The dynamic circuit of claim 5, wherein the output stage comprises the first and second nodes, the output stage further comprising:
   a first driver device that inputs a value on the first node; and
   a second driver device that inputs a value on the second node;
   wherein the first and second driver devices selectively drive the output signal.

7. The dynamic circuit of claim 5, wherein, depending on a value on the reset signal, the reset signal resets the second node to a value that the second node had before the falling edge of the input signal.

8. The dynamic circuit of claim 5, wherein the first control input stage inputs the input and reset signals, the first control input stage comprising:
   a first plurality of interconnected devices that selectively control a value on the first node.

9. The dynamic circuit of claim 8, wherein the first plurality of interconnected devices comprise a plurality of transistors.

10. The dynamic circuit of claim 5, wherein the second control input stage inputs the input and reset signals, the second control input stage comprising:
    a second plurality of interconnected devices that selectively control a value on the second node.

11. The dynamic circuit of claim 10, wherein the second plurality of interconnected devices comprise a plurality of transistors.

12. The dynamic circuit of claim 5, wherein, depending on a value on the reset signal, the reset signal resets the first node to a value that the first node had before the rising edge of the input signal.

13. The dynamic circuit of claim 5, wherein the output stage maintains a duty cycle of the input signal on the output signal.

14. The dynamic circuit of claim 5, wherein the input signal is a clock signal.

15. A method for an output stage of a dynamic circuit, comprising:
    inputting a first node to a first driver device;
    inputting a second node to a second driver device;
    selectively triggering the first node on a rising edge of an input signal;
    selectively triggering the second node on a falling edge of the input signal; and
    generating an output signal based on the first and second driver devices,
    wherein at least one of a value on the first node and a value on the second node is dependent on the output signal.

16. The method of claim 15, wherein the first node selectively controls the first driver device, and wherein the second node selectively controls the second driver device.

17. The method of claim 15, wherein, depending on the output signal, the first node is reset to a value that the first node had before the rising edge of the input signal.

18. The method of claim 15, wherein the first driver device is a first transistor, and wherein the second driver device is a second transistor.

19. The method of claim 15, wherein, depending on the output signal, the second node is reset to a value that the second node had before the falling edge of the input signal.

20. A method for performing dynamic circuit operations, comprising:
    inputting an input signal to a first control input stage that selectively controls a first node;
    inputting the input signal to a second control input stage that selectively controls a second node;
    selectively triggering the first node on a rising edge of the input signal;
    selectively triggering the second node on a falling edge of the input signal;
    generating an output signal from an output stage dependent on the first and second nodes; and
    selectively generating a reset signal dependent on the output signal.

21. The method of claim 20, further comprising at the output stage:
    inputting a value on the first node to a first driver device;
    inputting a value on the second node to a second driver device; and
    selectively driving the output signal based on the first and second driver devices.

22. The method of claim 20, further comprising:
    inputting the reset signal to the first control input stage; and
    inputting the reset signal to the second control input stage.

23. The method of claim 20, further comprising:
    using the reset signal to selectively reset the first node to a value that the first node had before the rising edge of the input signal.

24. The method of claim 20, further comprising:
    maintaining a duty cycle of the input signal on the output signal.

25. The method of claim 20, wherein the input signal is a clock signal.

26. The method of claim 20, further comprising:
    using the reset signal to selectively reset the second node to a value that the second node had before the falling edge of the input signal.

27. A dynamic circuit, comprising:
    means for selectively triggering a first node upon receiving a rising edge of an input signal;
    means for selectively triggering a second node upon receiving a falling edge of the input signal;
    means for generating an output signal based on values on the first and second nodes; and
    means for generating a reset signal based on the output signal.

* * * * *